US007078279B2

(12) United States Patent
Yoo et al.

(10) Patent No.: US 7,078,279 B2
(45) Date of Patent: Jul. 18, 2006

(54) MANUFACTURING METHOD OF A THIN FILM TRANSISTOR ARRAY SUBSTRATE

(75) Inventors: Soon Sung Yoo, Gunpo-shi (KR); Heung Lyul Cho, Suwon-shi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/950,493

(22) Filed: Sep. 28, 2004

(65) Prior Publication Data

US 2005/0079657 A1    Apr. 14, 2005

(30) Foreign Application Priority Data

Oct. 10, 2003    (KR) ...................... 10-2003-0070698

(51) Int. Cl.
*H01L 21/336* (2006.01)
*H01L 29/41* (2006.01)
*G02F 1/1343* (2006.01)

(52) U.S. Cl. ...................... 438/155; 438/158; 438/701; 438/713; 438/951

(58) Field of Classification Search ................ 438/155, 438/158, 701, 713, 954, FOR. 200; 257/E21.025, 257/E21.036, E21.414
See application file for complete search history.

(56) References Cited

U.S. PATENT DOCUMENTS

| | | | | |
|---|---|---|---|---|
| 5,391,507 A | * | 2/1995 | Kwasnick et al. | 438/158 |
| 5,527,726 A | * | 6/1996 | Possin et al. | 438/159 |
| 5,541,128 A | | 7/1996 | Kwasnick et al. | |
| 6,019,796 A | * | 2/2000 | Mei et al. | 438/151 |
| 6,156,583 A | * | 12/2000 | Hwang | 438/30 |
| 6,653,178 B1 | * | 11/2003 | Tsujimura et al. | 438/158 |
| 2002/0139983 A1 | | 10/2002 | Choi et al. | |

* cited by examiner

*Primary Examiner*—George Fourson
(74) *Attorney, Agent, or Firm*—McKenna Long & Aldridge LLP

(57) ABSTRACT

A method of manufacturing a thin film transistor capable of simplifying a substrate structure and a manufacturing process is disclosed. The method of manufacturing a thin film transistor array substrate includes involves a three-round mask process, which includes: forming a gate pattern on a substrate; forming a gate insulating film on the substrate having the gate pattern thereon; forming a source/drain pattern and a semiconductor pattern; forming a passivation film to protect the thin film transistor on an entire surface of the substrate; forming a photo-resist pattern on the passivation film; patterning the passivation film using the photo-resist pattern to form a passivation film pattern; and forming a transparent electrode pattern being extended from a lateral surface of the passivation film pattern and formed at an area except for the passivation film pattern.

28 Claims, 26 Drawing Sheets

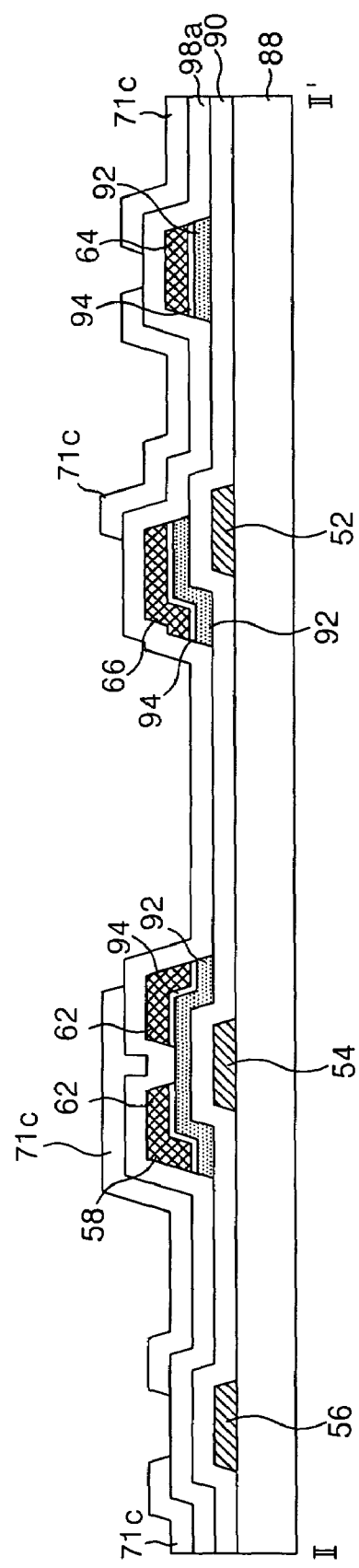

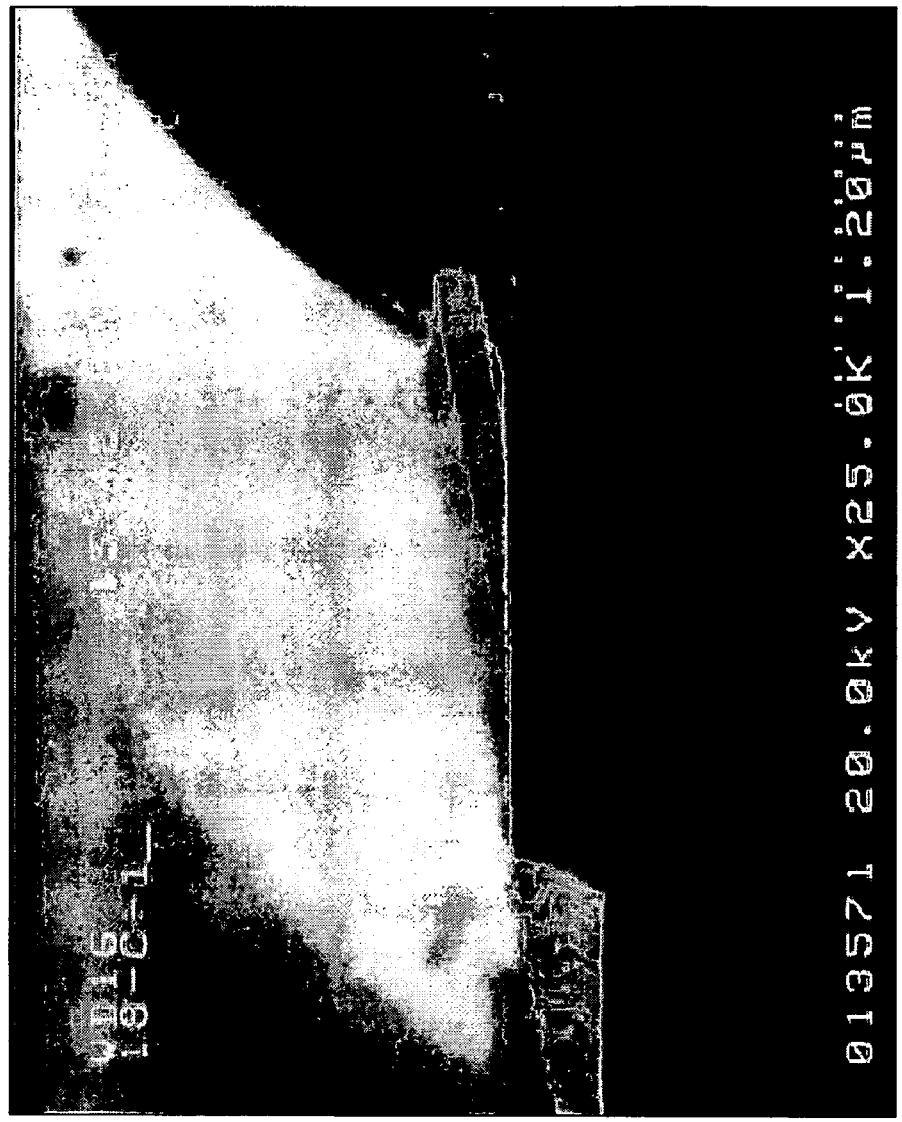

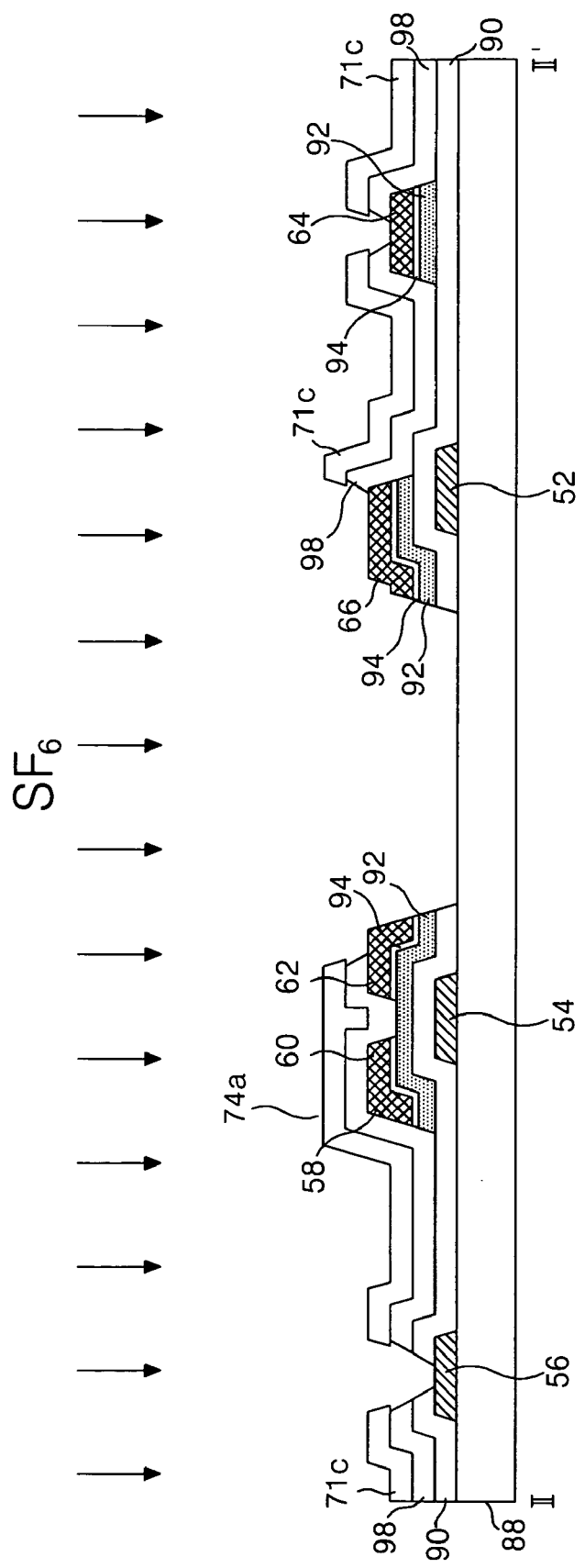

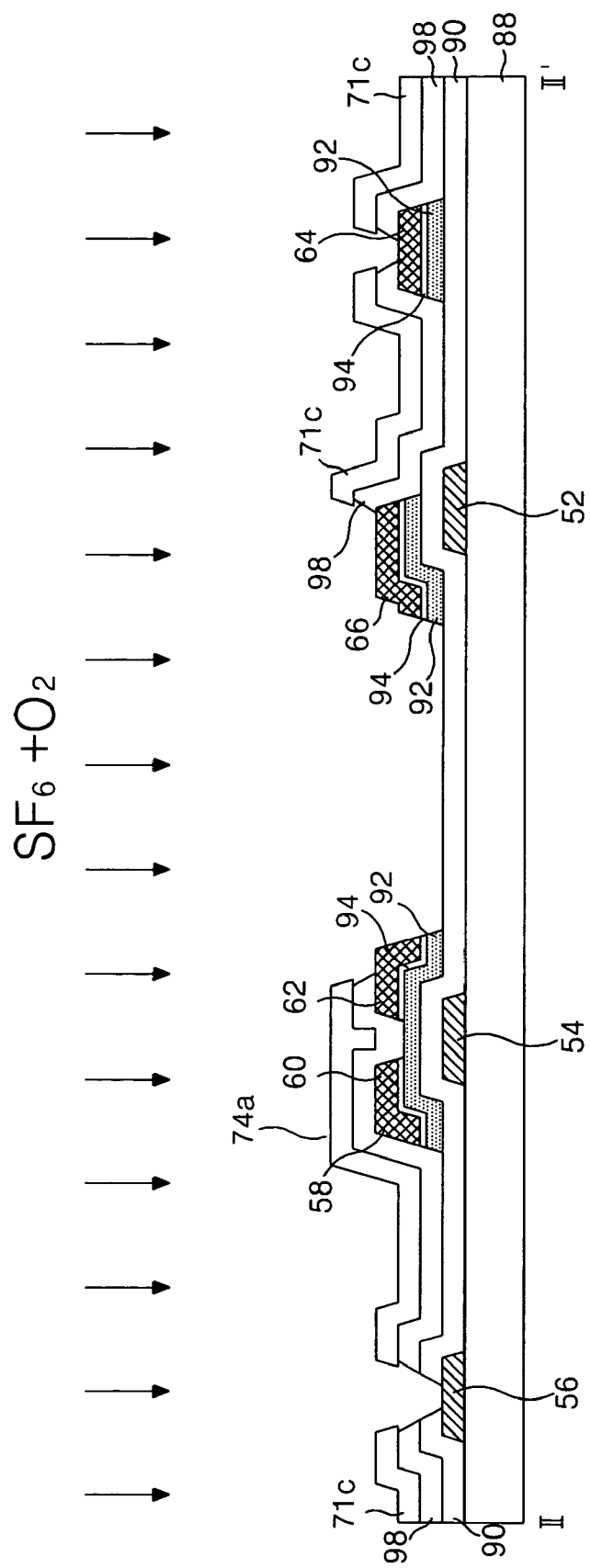

MANUFACTURING METHOD OF A THIN FILM TRANSISTOR ARRAY SUBSTRATE

This application claims the benefit of Korean Patent Application No. P2003-70698 filed in Korea on Oct. 10, 2003, which is hereby incorporated by reference for all purposes as if fully set forth herein.

BACKGROUND OF THE INVENTION

1. Field of the Invention

The present invention relates to a method of manufacturing a thin film transistor array substrate, and more particularly, to a method of manufacturing a thin film transistor array substrate capable of reducing the number of a mask process.

2. Description of the Related Art

In general, a liquid crystal display device represents an image by means of adjusting a transmittance of a liquid crystal material using an electric field. For this purpose, the liquid crystal display device comprises a liquid crystal display panel in which the liquid crystal cells are arranged in a matrix pattern, and a driving circuit for driving the liquid crystal display panel.

The liquid crystal display panel includes the thin film transistor array substrate and a color filter array substrate facing each other, a spacer located for fixedly maintaining a cell gap between two substrates and a liquid crystal injected into the cell gap.

The thin film transistor array substrate includes gate lines and data lines, a thin film transistor formed as a switching device at every crossing of the gate lines and the data lines, a pixel electrode connected to the thin film transistor substantially defining a liquid crystal cell, and an alignment film applied to the substrate. The gate lines and the data lines receive signal from the driving circuits through each of their respective pad parts. The thin film transistor, in response to a scan signal supplied to a gate line, supplies to the pixel electrode a pixel voltage signal applied to the data line.

The color filter array substrate includes a color filter formed to correspond to the liquid crystal cells, a black matrix for reflecting external light and separating between the color filters, a common electrode for commonly supplying a reference voltage to the liquid crystal cells, and the alignment film applied to the substrate.

The liquid crystal display panel is fabricated by combining the thin film transistor array substrate and the color filter array substrate which are separately manufactured, injecting the liquid crystal material between the substrates, and sealing the substrates having the liquid crystal material between them.

In such a liquid crystal display device, thin film transistor array substrate fabrication involves a semiconductor process and requires a plurality of mask processes, which complicates the manufacturing process. This is a major factor in the manufacturing cost of the liquid crystal display panel. In order to solve this, a thin film transistor array substrate has been developed with a goal of reducing the number of mask processes. This is because one mask process includes a plurality of sub-processes such as thin film deposition, cleaning, photolithography, etching, photo-resist stripping, inspection processes and the like. Recent development efforts have resulted in a four-round mask process that eliminated one mask process from an existing five-round standard mask process.

FIG. 1 is a plan view illustrating a thin film transistor array substrate adopting a related art four-round mask process, and FIG. 2 is a sectional view illustrating the thin film transistor array substrate taken along line I–I' in FIG. 1.

The thin film transistor array substrate, shown in FIG. 1 and FIG. 2, includes gate lines 2 and data lines 4 crossing with each other and having a gate insulation film between them on a lower substrate 42, a thin film transistor 6 formed at every crossing, and a pixel electrode 18 formed in the cell region substantially defined by the crossing of the gate lines 2 and data lines 4. Further, the thin film transistor array substrate includes a storage capacitor 20 formed at an overlapped part of the pixel electrode 18, a pre-stage gate line 2, a gate pad part 26 connected to the gate line 2, and a data pad part 34 connected to the data line 4.

The thin film transistor 6 includes a gate electrode 8 connected to the gate line 2, a source electrode 10 connected to the data line 4, a drain electrode 12 connected to a pixel electrode 18, and an active layer 14 of semiconductor pattern 47, which defines a channel between the source electrode 10 and the drain electrode 12 and overlapping the gate electrode 8. Referring to FIG. 2, the active layer 14 overlaps with a lower data pad electrode 36, a storage electrode 22, the data line 4, the source electrode 10 and the drain electrode 12, and further includes a channel portion defined between the source electrode 10 and the drain electrode 12. Further formed on the active layer 14 are the lower data pad electrode 36, the storage electrode 22, the data line 4, the source electrode 10, the drain electrode 12 and an ohmic contact layer 48 of the semiconductor pattern 47 for making an ohmic contact. The thin film transistor 6 responds to the gate signal supplied to the gate line 2 and applies a pixel voltage signal supplied to the data line 4 to the pixel electrode 18.

The pixel electrode 18 is generally connected to the drain electrode 12 of the thin film transistor 6 via a first contact hole 16 passing through a passivation film 50. The pixel electrode 18 generates a potential difference along with the common electrode formed on the upper substrate (not shown) when a pixel voltage is applied to the electrode. By this potential difference, the liquid crystal molecules located between the thin film transistor substrate and the upper substrate rotate due to the molecules' dielectric anisotropy, and makes incident light through the pixel electrode 18 from the light source (not shown) transmit to the upper substrate.

The storage capacitor 20 includes a pre-stage gate line 2; a storage electrode 22 overlapping the pre-stage gate line 2 having a gate insulating film 44; the active layer 14 and the ohmic contact layer 48 between the active layer 14 and the storage electrode 22. The pixel electrode 18, which connects to the storage electrode 22 through contact hole 24, is formed on the passivation film 50 and overlaps the storage electrode 22. The storage capacitor 20 substantially maintains the pixel voltage applied to the pixel electrode IP until a next pixel voltage is applied.

The gate line 2 is connected to a gate driver (not shown) through the gate pad part 26. The gate pad part 26 includes a lower gate pad electrode 28 extending from the gate line 2 and an upper gate pad electrode 32 connected to the lower gate pad electrode 28 via a third contact hole 30 passing through both of the gate insulating film 44 and the passivation film 50. The data line 4 is connected to the data driver (not shown) through the data pad part 34. The data pad part 34 includes the lower data pad electrode 36 extending from the data line 4 and an upper data pad electrode 40 connected to the lower data pad electrode 36 via a fourth contact hole 38 passing through the passivation film 50.

The thin film transistor substrate having the above-mentioned configuration is formed through the use of the four-round mask process, according to the related art.

FIGS. 3A to 3D are sectional views sequentially illustrating a method of manufacturing the thin film transistor substrate.

Referring to FIG. 3A, gate patterns are formed on the lower substrate 42.

On the lower substrate 42, a gate metal layer is formed by a deposition method such as a sputtering method. Subsequently, the gate metal layer is then patterned by a photolithography and an etching process using a first mask to thereby form the gate patterns including the gate line 2, the gate electrode 8 and the lower gate pad electrode 28. A gate metal, which may include a chrome (Cr), a molybdenum (Mo), an aluminium (Al) and the like are used in the form of a single-layer structure or a double-layer structure.

Referring to FIG. 3B, the gate insulating film 44, the active layer 14, the ohmic contact layer 48 and source/drain patterns are sequentially formed on the lower substrate 42 provided with the gate pattern.

The gate insulating film 44, an amorphous silicon layer, a n+ amorphous silicon layer and a source/drain metal layer are sequentially formed on the lower substrate 42 having the gate patterns thereon by a deposition technique such as plasma enhanced chemical vapor deposition (PECVD) or sputtering.

A photo-resist pattern is formed on the source/drain metal layer by a photolithography process using a second mask. In this case, a diffractive exposure mask having a diffractive exposing part at a channel portion of the thin film transistor is used as a second mask, thereby allowing a photo-resist pattern of the channel portion to have a lower height than the other source/drain patterns.

Subsequently, the source/drain metal layer is then patterned by a wet etching process using the photo-resist pattern, to thereby form source/drain patterns including the data line 4, the source electrode 10, the drain electrode 12 being integral to the source electrode 10 and the storage electrode 22.

Next, the amorphous silicon layer and the n+ amorphous silicon layer are patterned at the same time by a dry etching process using the same photo-resist pattern to thereby form the semiconductor pattern 47 including the ohmic contact layer 48 and the active layer 14.

The photo-resist pattern having a relatively low height is removed from the channel portion by an ashing process and thereafter the source/drain pattern and the ohmic contact layer 48 of the channel portion are etched by a dry etching process. Accordingly, the active layer 14 of the channel portion is exposed to separate the source electrode 10 from the drain electrode 12.

Thereafter, a remainder of the photo-resist pattern left on the source/drain pattern is removed using a stripping process.

The gate insulating film 44 is made of an inorganic insulating material such as silicon oxide ($SiO_x$) or silicon nitride ($SiN_x$). A metal for the source/drain pattern includes a molybdenum (Mo), a titanium (Ti), tantalum (Ta) or a molybdenum alloy.

Referring to FIG. 3C, the passivation film 50 includes first to fourth contact holes 16, 24, 30 and 38, which are formed on the gate insulating film 44 having the source/drain patterns.

The passivation film 50 is entirely formed on the gate insulating film 44 having the source/drain patterns by a deposition technique such as a plasma enhanced chemical vapor deposition (PECVD). The passivation film 50 is patterned by a photolithography and an etching process using a third mask to thereby form the first to fourth contact holes 16, 24, 30 and 38. The first contact hole 16 is formed in such a manner to pass through the passivation film 50 and expose the drain electrode 12, whereas the second contact hole 24 is formed in such a manner to pass through the passivation film 50 and expose the storage electrode 22. The third contact hole 30 is formed in such a manner to pass through the passivation film 50 and the gate insulating film 44 and expose the lower gate pad electrode 28, whereas the fourth contact hole 38 is formed in such a manner to pass through the passsivation film 50 and expose the lower data pad electrode 36.

The passivation film 50 is generally made of an inorganic insulating material such as a material of the gate insulating film 44 or an organic insulating material having a small dielectric constant such as an acrylic organic compound, BCB (benzocyclobutene) or PFCB (perfluorocyclobutane).

Referring to FIG. 3D, transparent electrode patterns are formed on the passivation film 50. More specifically, a transparent electrode material is entirely deposited on the passivation film 50 by a deposition technique such as sputtering and the like. Then, the transparent electrode material is patterned by a photolithography and an etching process using a fourth mask, to thereby provide the transparent electrode patterns including the pixel electrode 18, the upper gate pad electrode 32 and the upper data pad electrode 40. The pixel electrode 18 is electrically connected, via the first contact hole 16, to the drain electrode 12 and is electrically connected, via the second contact hole 24, to the storage electrode 22 overlapping a pre-stage gate line 2. The upper gate pad electrode 32 is electrically connected, via the third contact hole 30, to the lower gate pad electrode 28. The upper data pad electrode 40 is electrically connected, via the fourth contact hole 38, to the lower data pad electrode 36. The transparent electrode material may be made of an indium-tin-oxide (ITO), a tin-oxide (TO) or an indium-zinc-oxide (IZO).

As described above, the related art thin film transistor array substrate and the manufacturing method thereof adopts a four-round mask process, thereby reducing the number of manufacturing processes in comparison with the five-round mask process and hence reducing a manufacturing cost accordingly. However, since the four-round mask process still has a complex manufacturing process and a limitation in reducing the manufacturing cost, there is a need for an approach that is capable of further simplifying the manufacturing process and further reducing the manufacturing cost.

SUMMARY OF THE INVENTION

Accordingly, the present invention is directed to a manufacturing method of a thin film transistor array substrate that substantially obviates one or more of the problems due to limitations and disadvantages of the related art.

An advantage of the present invention to provide a simplified thin film transistor array manufacturing process.

Another advantage of the present invention is to reduce the number of mask processes required for manufacturing a thin film transistor array substrate.

In order to achieve these and other advantages of the invention, a method of manufacturing a thin film transistor array comprises forming a gate pattern on a substrate; forming a gate insulating film on the substrate; forming a source/drain pattern and a semiconductor pattern on the substrate; forming a passivation film on the substrate; forming a photo-resist pattern on the passivation film; patterning the passivation film using the photo-resist pattern to form a passivation film pattern, the patterning the passivation film including over-etching the passivation film; forming a transparent electrode film on the substrate; and removing the photo-resist pattern and the transparent electrode film disposed on the photo-resist pattern, forming a transparent electrode pattern.

Forming the passivation film pattern includes forming the passivation film pattern having a line width narrower that that of the photo-resist pattern.

Forming the passivation film pattern includes patterning the passivation film using an etching gas in which a ratio of sulfur hexa fluoride $SF_6$ is higher than that of oxygen $O_2$.

The ratio of sulfur hexa fluoride $SF_6$ and oxygen $O_2$ is about 3:1 to about 10:1.

Forming the passivation film pattern includes etching the passivation film under a pressure of about 300 mtorr to 400 mtorr to form the passivation pattern.

Forming the passivation film pattern includes patterning the passivation film using sulfur hexa fluoride $SF_6$ using the photo-resist pattern as a mask; and patterning the gate insulating film using a mixed gas including sulfur hexa fluoride $SF_6$ and oxygen $O_2$.

The mixed gas includes sulfur hexa fluoride $SF_6$ and the oxygen $O_2$ with a mixing ratio of about 1:3.

Forming the passivation film pattern includes patterning the passivation film and the gate insulating film using sulfur hexa fluoride $SF_6$ and using the photo-resist pattern as a mask.

Forming the gate pattern includes forming a gate electrode of a thin film transistor; forming a gate line connected to the gate electrode; and forming a lower gate pad electrode connected to the gate line, on the substrate.

The transparent electrode pattern includes a pixel electrode connected to the thin film transistor, an upper gate pad electrode connected to the lower gate pad electrode, and an upper data pad electrode connected to the lower data pad electrode.

The method further comprises forming an additional gate line; and forming a storage electrode overlapping the another gate line, wherein a portion of the semiconductor pattern is disposed between the another gate line and the storage electrode, thereby substantially forming a storage capacitor.

Forming the source/drain pattern includes forming a source electrode of the thin film transistor; forming a drain electrode of the thin film transistor; and forming a data line connected to the source electrode.

The drain electrode and the storage electrode connect with a pixel electrode, and wherein the drain electrode and the storage electrode are partially exposed by the passivation film pattern.

The method further comprises forming a lower data pad electrode and an upper data pad electrode, the lower data pad electrode formed with a material substantially similar to that of the data line on a co-plane along with the data line, and extended from the data line to connect to the upper data pad electrode.

Forming the semiconductor pattern includes forming the semiconductor pattern beneath the source/drain pattern along the source/drain pattern.

Removing the photo-resist pattern includes removing the photo-resist pattern and the transparent electrode material on the photo-resist pattern using a stripping process to form the transparent electrode pattern.

The method further comprises forming a lower data pad electrode and an upper data pad electrode, the lower data pad electrode connected to the data line via the upper data pad electrode, and formed with a material substantially similar to that of the gate pattern on a co-plane along with the gate pattern.

In order to achieve these and other advantages of the invention, a method of manufacturing a thin film transistor array substrate comprises forming a thin film transistor on a substrate; forming a passivation film on the substrate; forming a photo-resist pattern on the passivation film; patterning the passivation film by using the photo-resist pattern to form a passivation film pattern, the patterning including over-etching the passivation film; and forming a pixel electrode being extended from a lateral surface of the passivation film pattern and formed on an area substantially exclusive of the passivation film pattern.

Forming the passivation film pattern includes forming the passivation film pattern having a line width narrower than that of the photo-resist pattern.

Forming the pixel electrode includes forming a transparent electrode material on the substrate having a remainder of the passsivation film pattern and the photo-resist pattern left thereon; and removing the photo-resist pattern and the transparent electrode material on the photo-resist pattern using a stripping process.

In order to achieve these and other advantages of the invention, a method of manufacturing a thin film transistor array substrate comprises forming a gate pattern on a substrate; forming a gate insulating film on the substrate; forming a source/drain pattern and a semiconductor pattern on the substrate; forming a passivation film on the substrate; forming a photo-resist pattern on the passivation film; patterning the passivation film using the photo-resist pattern to form a passivation film pattern, the passivation film pattern having a width narrower than a line width of the photo-resist pattern; and forming a transparent electrode pattern on the substrate.

Forming the passivation film pattern includes patterning the passivation film using an etching gas in which a proportion of sulfur hexa fluoride $SF_6$ is higher than a proportion of oxygen $O_2$.

The a ratio of sulfur hexa fluoride $SF_6$ and oxygen $O_2$ is approximately 3:1 to 10:1.

Forming the passivation film pattern includes etching the passivation film under a pressure of about 300 mtorr to 400 mtorr.

Forming the passivation film pattern includes the steps of patterning the passivation film using sulfur hexa fluoride $SF_6$ and using the photo-resist pattern as a mask; and patterning the gate insulating film using a mixed gas comprising sulfur hexa fluoride $SF_6$ and oxygen $O_2$.

The mixed gas includes a mixing ratio of sulfur hexa fluoride $SF_6$ and oxygen $O_2$ of about 1:3.

Forming the passivation film pattern includes using sulfur hexa fluoride $SF_6$ and using the photo-resist pattern as a mask.

Forming a transparent electrode pattern includes forming a transparent electrode material on the substrate having a remainder of the passsivation film pattern and the photo-resist pattern left thereon; and removing the photo-resist pattern and the transparent electrode material disposed on the photo-resist pattern using a stripping process.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIGS. 10A to 10C are configurations representing an experiment result about a generation of an undercut shown in FIG. 9C.

FIGS. 11A to 11B are sectional views illustrating an etching process of a second step in the manufacturing method of the thin film transistor array substrate according to the present invention.

DETAILED DESCRIPTION OF THE ILLUSTRATED EMBODIMENT

Reference will now be made in detail to exemplary embodiments of the present invention, examples of which are illustrated in the accompanying drawings.

Hereinafter, the exemplary embodiments of the present invention will be described in detail with reference to FIGS. 4 to 11B.

Figure 1:
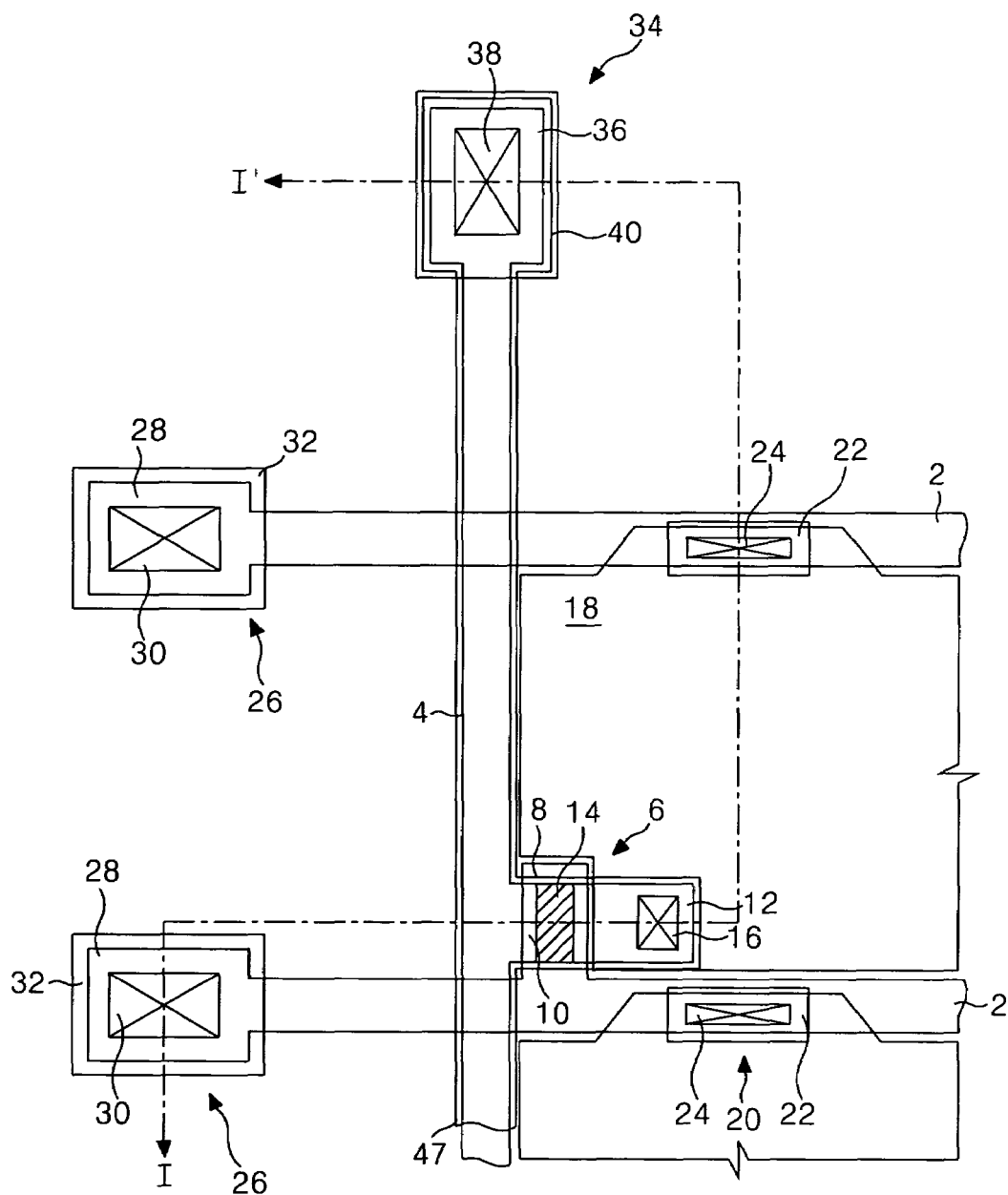
FIG. 1 is a plan view illustrating a related art thin film transistor array substrate.
Figure 2:
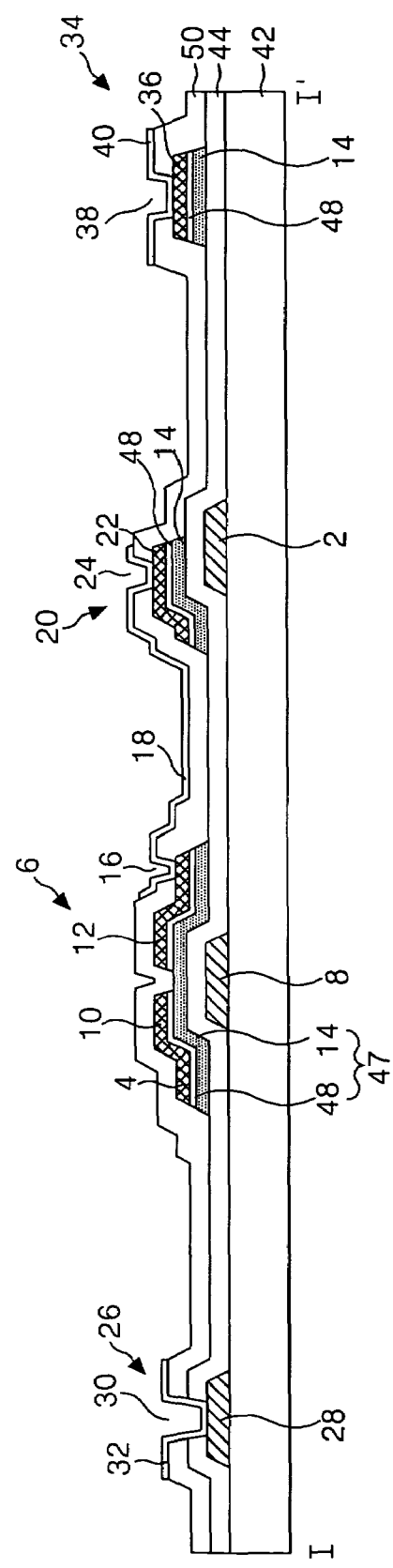
FIG. 2 is a sectional view of the thin film transistor array substrate taken along the line I–I' in FIG. 1.
Figure 3A:
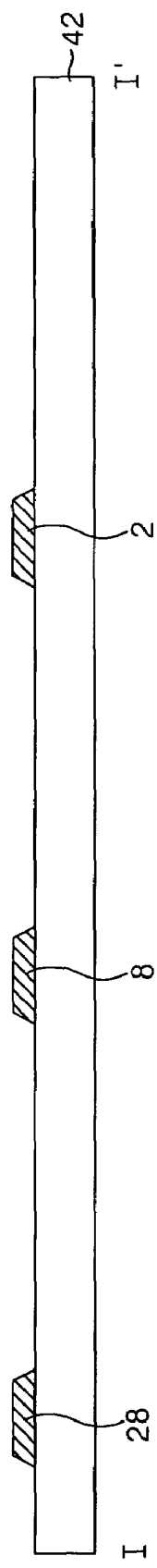
FIGS. 3A to 3D are sectional views sequentially illustrating a method of manufacturing the thin film transistor array substrate shown in FIG. 2.
Figure 3B:
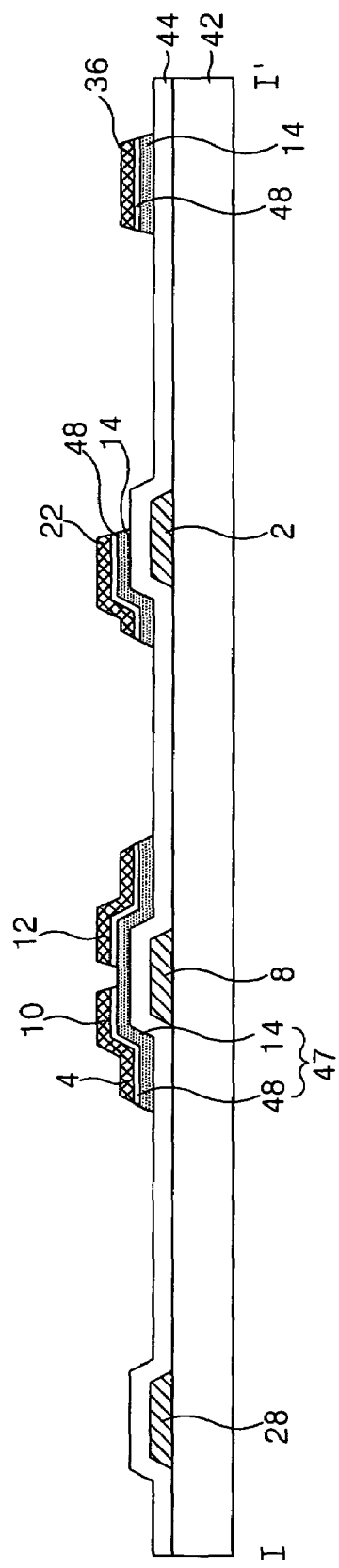
Figure 3C:
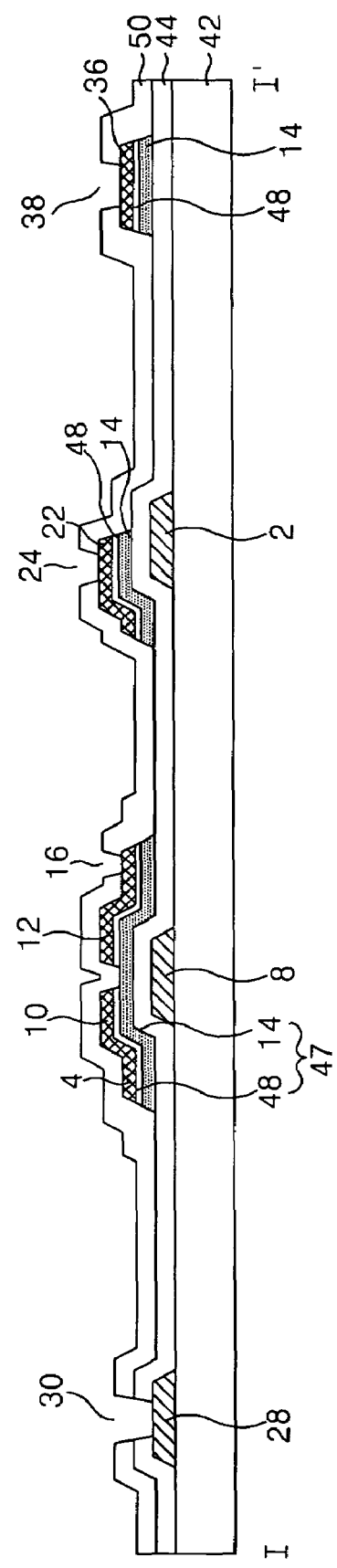
Figure 3D:
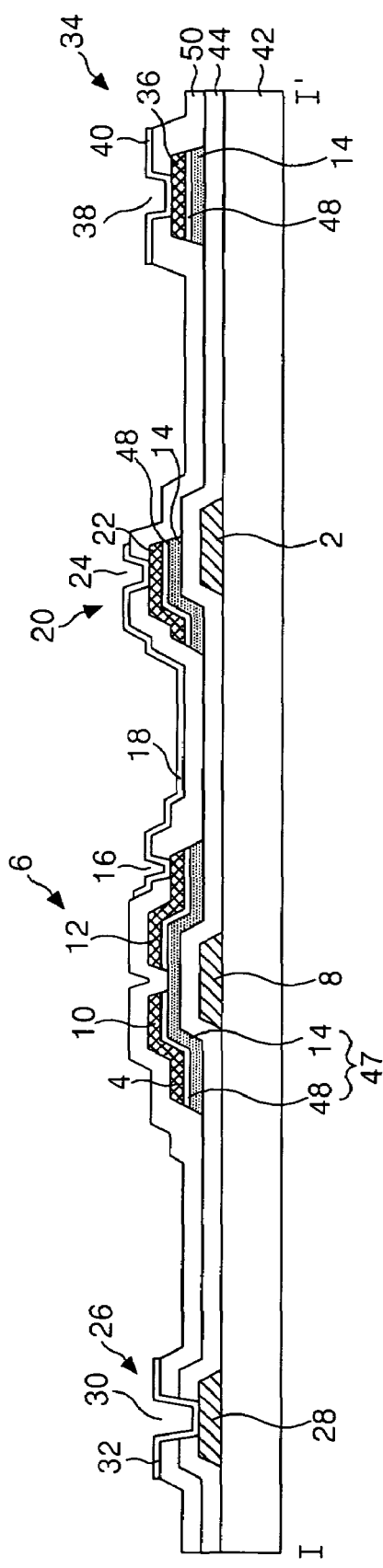
Figure 4:
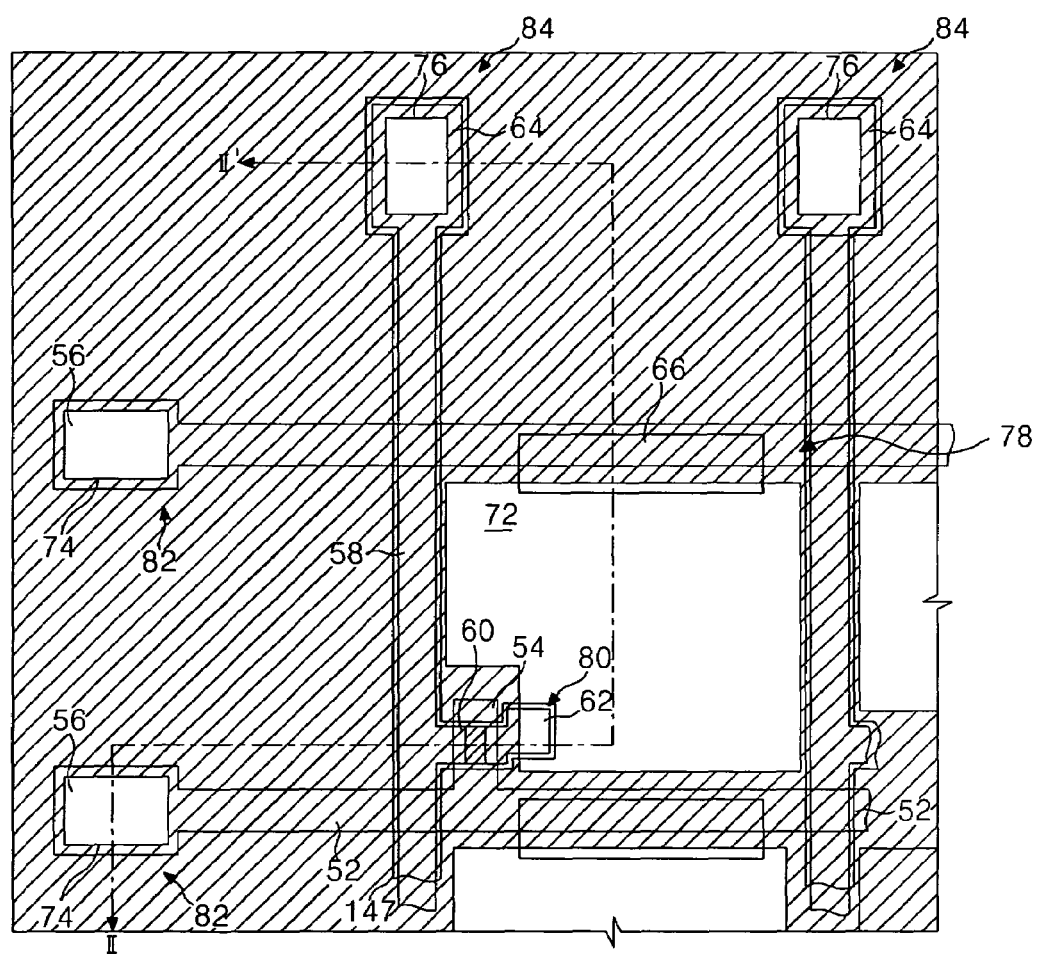
FIG. 4 is a plan view illustrating a thin film transistor array substrate according to an embodiment of the present invention.
Figure 5:
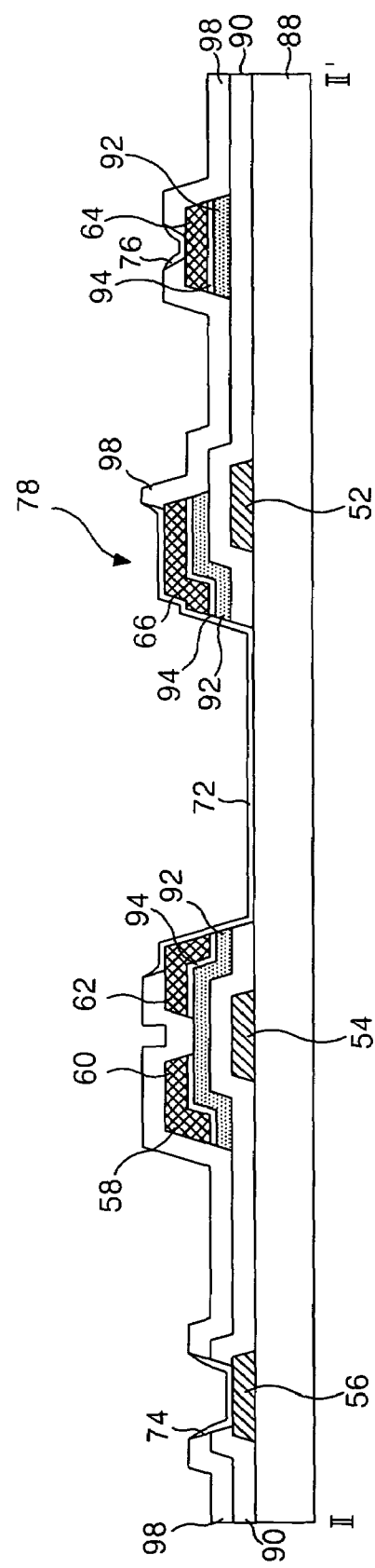
FIG. 5 is a sectional view of the thin film transistor array substrate taken along the line II–II' in FIG. 4.

FIG. 4 is a plan view showing a thin film transistor array substrate according to an exemplary embodiment of the present invention, and FIG. 5 is a sectional view of the thin film transistor array substrate taken along the line II–II' in FIG. 4.

Referring to FIGS. 4 and 5, the thin film transistor array substrate includes a gate line 52, a data line 58, and a gate insulating pattern 90 between them, all of which may be formed on a lower substrate 88. The gate lines 52 and the data lines 58 generally cross each other, with a thin film transistor 80 formed at each crossing, and a pixel electrode 72 formed in a cell region defined by the crossing. Further, the thin film transistor array substrate includes a storage capacitor 78 formed at an overlapped portion between a pre-stage gate line 52 and a storage electrode 66 connected to the pixel electrode 72, a gate pad part 82 connected to the gate line 52, and a data pad part 84 connected to the data line 58.

The thin film transistor 80 includes a gate electrode 54 connected to the gate line 52, a source electrode 60 connected to the data line 58, a drain electrode 62 connected to the pixel electrode 72, and a semiconductor pattern including an active layer 92 overlapping the gate electrode 54 with the gate insulating pattern 90 positioned therebetween and forming a channel between the source electrode 60 and the drain electrode 62. The thin film transistor 80, in response to a gate signal supplied to the gate line 52, causes a pixel voltage signal supplied to the data line 58 to be applied to the pixel electrode 72 and be maintained therein.

The semiconductor pattern includes an active layer 92 having a channel portion between the source electrode 60 and the drain electrode 62. The active layer 92 may be overlapped with the source electrode 60, the drain electrode 62, the data line 58 and the lower data pad electrode 64. Also, the active layer 92 may overlap the storage electrode 66 and may be formed to partially overlap with the gate line 52 with the gate insulating pattern 90 positioned therebetween. The semiconductor pattern may further include an ohmic contact layer 94 formed on the active layer 92 for making ohmic contact with the source electrode 60, the drain electrode 62, the storage electrode 66, the data line 58, and the lower data pad electrode 64.

The pixel electrode 72 may be connected to the drain electrode 62 of the thin film transistor 80 exposed to the exterior by a passivation film pattern 98. The pixel electrode 72 may form a potential difference along with a common electrode (not shown) formed on an upper substrate by accumulating charge according to the pixel voltage. By this potential difference, the molecule making up the liquid crystal material located between the thin film transistor substrate and the upper substrate generally rotate due to a dielectric anisotropy of the liquid crystal material. The rotation of the LC molecules makes light incident on the pixel electrode 72 from a light source (not shown) transmit toward the upper substrate.

The storage capacitor 78 may include a pre-stage gate line 52 and the storage electrode 66 overlapping the pre-stage gate line. The storage electrode 66 may be connected to the pixel electrode 72. The gate insulating film 90 substantially forms the dielectric of the storage capacitor 78, with the gate line 52 on one side of the gate insulating pattern 90, and the storage electrode 66, the active layer 92 and the ohmic contact layer 94 on the other. Herein, the pixel electrode 72 may be connected to the storage electrode 66 substantially at an interface that is clear of passivation film 98. The storage capacitor 78 may stably maintain the pixel voltage applied charged to the pixel electrode 72 until a next pixel voltage is applied.

The gate line 52 may be connected to a gate driver (not shown) through a gate pad part 82. The gate pad part 82 may include a lower gate pad electrode 56 extending from the gate line 52 and an upper gate pad electrode 74 connected on the lower gate pad electrode 56.

The data line 58 may be connected to a data driver (not shown) through a data pad part 84. The data pad part 84 may include a lower data pad electrode 64 extending from the data line 58 and an upper data pad electrode 76 connected on the lower data pad electrode 64. Further, the data pad part 84 may include the gate insulating layer 90, the active layer 92 and ohmic contact layer 94 formed between the lower data pad electrode 64 and the lower substrate 88.

The gate insulating pattern 90 and the passivation film pattern 98 are generally formed in the region where the pixel electrode 72, the upper gate pad electrode 74 and the upper data pad electrode 76 are not formed.

Herein, the passivation layer 98 and the gate insulating layer 90 may be patterned by a dry-etching technique using an etching gas in which sulfur hexa fluoride $SF_6$ and oxygen $O_2$ are mixed with a ratio of about 3:1 to about 10:1, or the passivation pattern 98 and the gate insulating pattern 90 may be patterned under a high pressure, for example, a pressure of about 300 mtorr to 400 about mtorr. Alternatively, the passivation layer 98 may be patterned using an etching gas consisting almost exclusively of sulfur hexa fluoride $SF_6$, and the gate insulating layer 90 may be patterned by an etching gas in which the sulfur hexa fluoride $SF_6$ and the oxygen $O_2$ are mixed but the mixing ratio proportion of the sulfur hexa fluoride $SF_6$ is decreased as compared with the above. Further, the passivation film pattern 98 and the gate insulating pattern 90 may be patterned by way of the dry etching using a sulfur hexa fluoride $SF_6$ etching gas, so that the passivation film pattern 98 is over-etched.

The thin film transistor array substrate having the above-mentioned configuration may be formed through the use of the three-round mask process. The method of manufacturing the thin film transistor array substrate according to the embodiment of the present invention using the three-round mask process may include the first mask process for forming the gate patterns, the second mask process for forming the semiconductor pattern and the source/drain pattern, and the third mask process for forming the gate insulating pattern 90, the passivation film pattern 98 and the transparent electrode patterns.

FIGS. 6A to 9E are plan views and sectional views sequentially illustrating an exemplary method of manufacturing the thin film transistor array substrate according to an exemplary embodiment of the present invention.

Figure 6A:
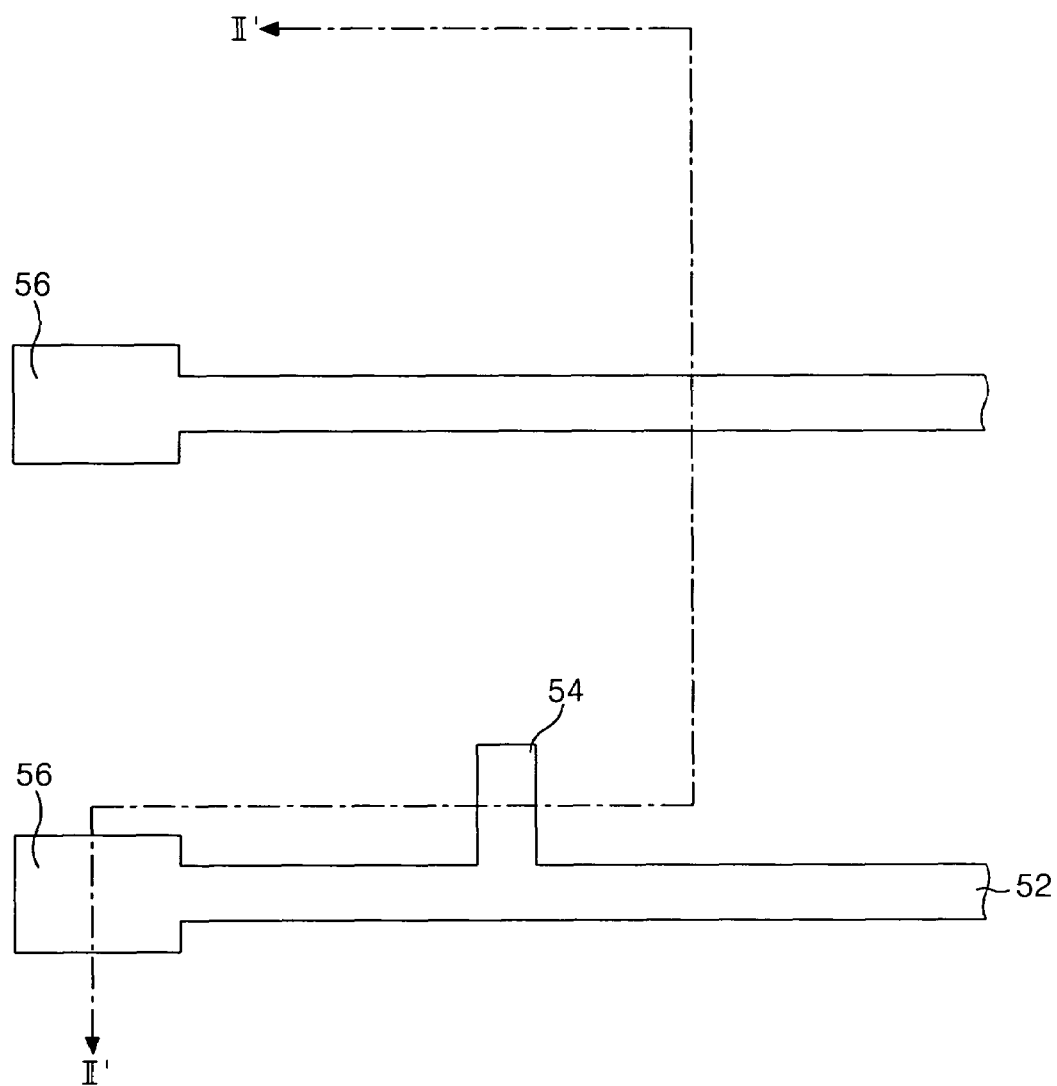
FIGS. 6A to 9E are sectional views showing a method of manufacturing the thin film transistor array substrate according to the embodiment of the present invention.
Figure 6B:
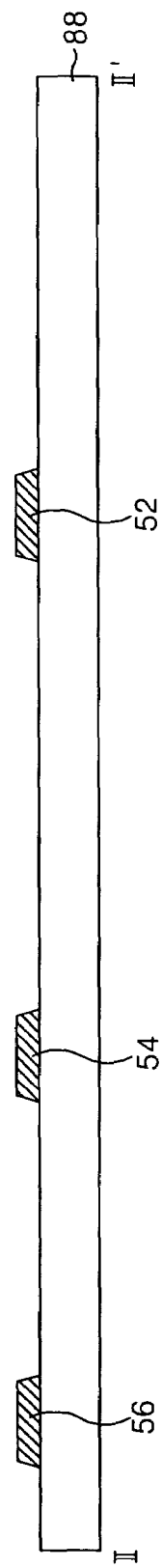

FIGS. 6A and 6B are a plan view and a sectional view, respectively, illustrating the gate patterns formed on the lower substrate 88 by the first mask process in an exemplary method of manufacturing the thin film transistor array substrate according to the present invention.

The gate metal layer may be formed on the lower substrate 88 by a deposition method such as a sputtering method. Subsequently, the gate metal layer may be patterned by a photolithography process using the first mask and an etching process, to form the gate patterns including the gate line 52, the gate electrode 54, and the lower gate pad electrode 56. As the gate metal, Cr, MoW, Cr/Al, Cu, Al(Nd), Mo/Al, Mo/Al(Nd), Cr/Al(Nd) and the like may be used in a form of a single layer or a double layer structure.

Figure 7A:
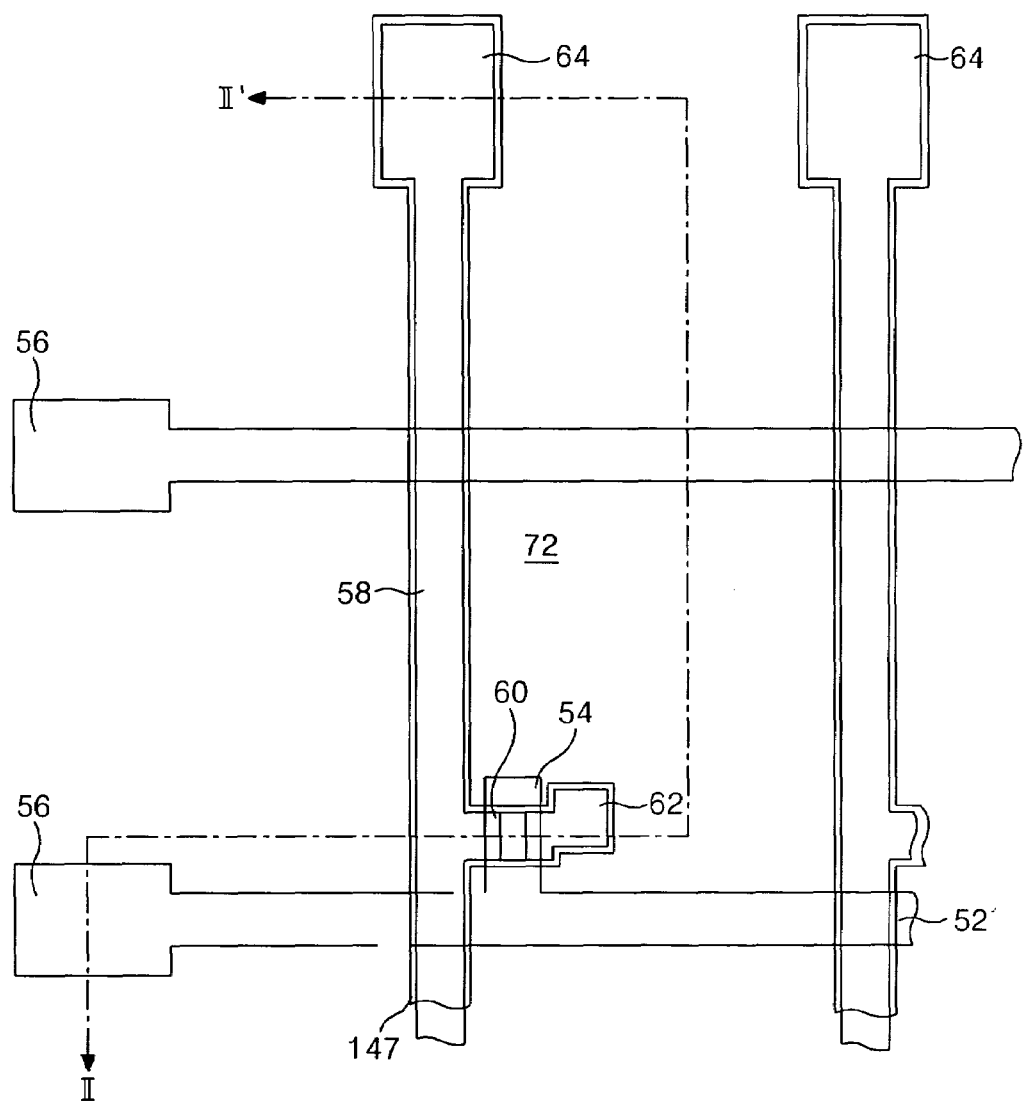
Figure 7B:
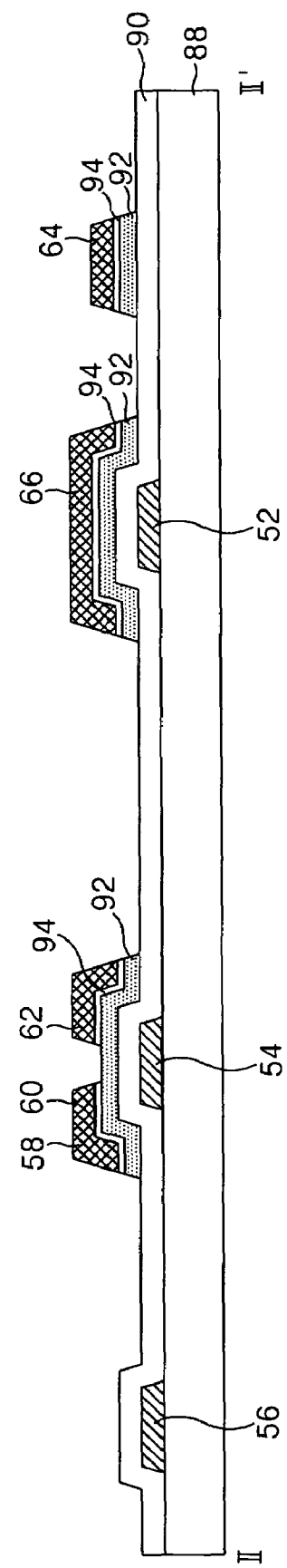

FIGS. 7A and 7B are a plan view and a sectional view, respectively, of the substrate including the source/drain pattern and the semiconductor pattern formed by the second mask process in the method of manufacturing the thin film transistor array substrate according to an exemplary embodiment of the present invention.

Figure 8A:
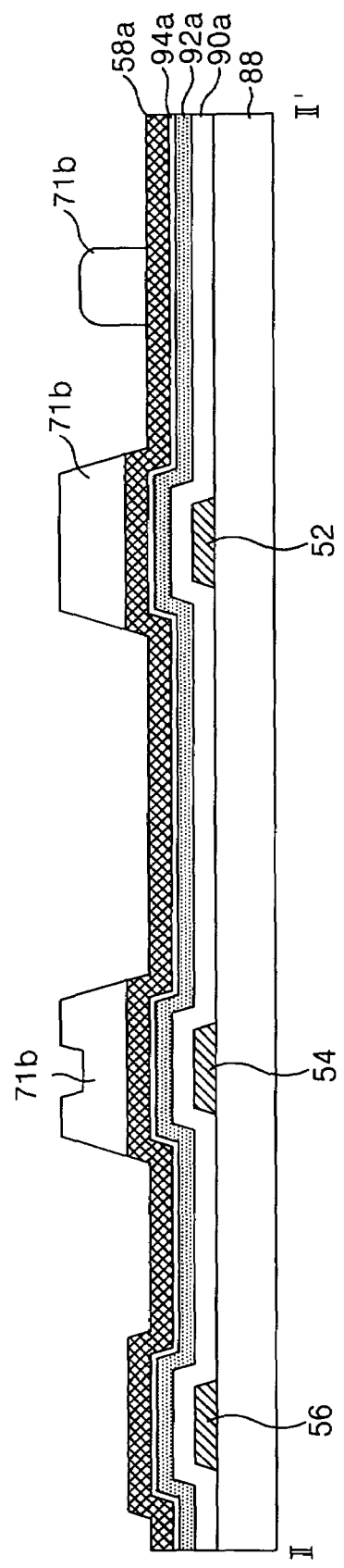

More specifically, as shown in FIG. 8A, a gate insulating layer 90a, an amorphous silicon ohmic contact layer 92a, a n+ amorphous silicon layer 94a, and a source/drain metal layer 58a may be sequentially formed on the lower substrate 88 having the gate patterns thereon by a deposition technique such as plasma enhanced chemical vapor deposition (PECVD) and sputtering. In an exemplary embodiment, the gate insulating layer 90a may be made of an inorganic insulating material such as silicon oxide ($SiO_x$) or silicon nitride ($SiN_x$). The source/drain metal layer may be made of molybdenum (Mo), titanium (Ti), tantalum (Ta) or molybdenum alloy.

Then, a photo-resist pattern 71b may be formed on the source/drain metal layer 58a by a photolithography process using a second mask and an etching process, as shown in FIG. 8A. In this case, a diffractive exposure mask having a diffractive exposing part at a channel portion of the thin film transistor may be used as a second mask, thereby allowing a photo-resist pattern of the channel portion to have a lower height than a photo-resist pattern of source/drain pattern.

Figure 8B:
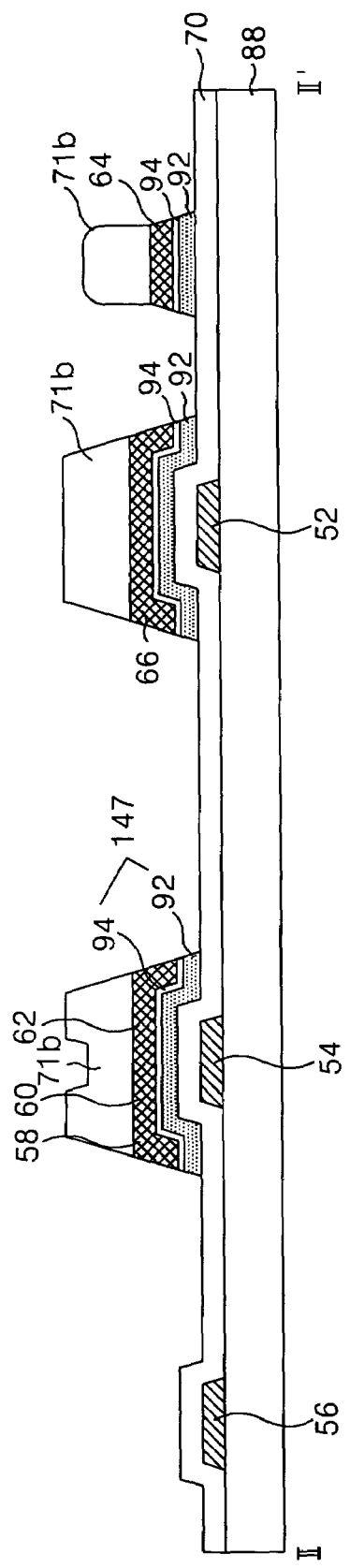

Subsequently, as shown in FIG. 8B, the source/drain metal layer 58a may be patterned by a wet etching process using the photo-resist pattern 71b to thereby provide source/drain patterns including the data line 58, the source electrode 60; the drain electrode 62, which at this point is being integral to the source electrode 60; the storage electrode 66; and the lower data pad electrode 64.

Using the same photo-resist pattern 71B, the amorphous silicon layer 92a and the n+ amorphous silicon layer 94a may be patterned in a single dry etching process thereby providing a semiconductor pattern 147 including the ohmic contact layer 94 and the active layer 92.

Figure 8C:
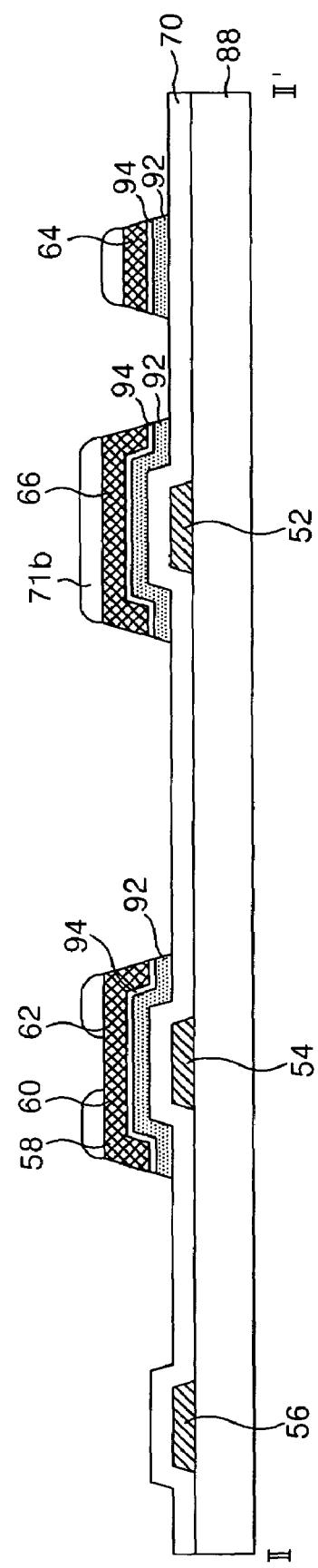
Figure 8D:
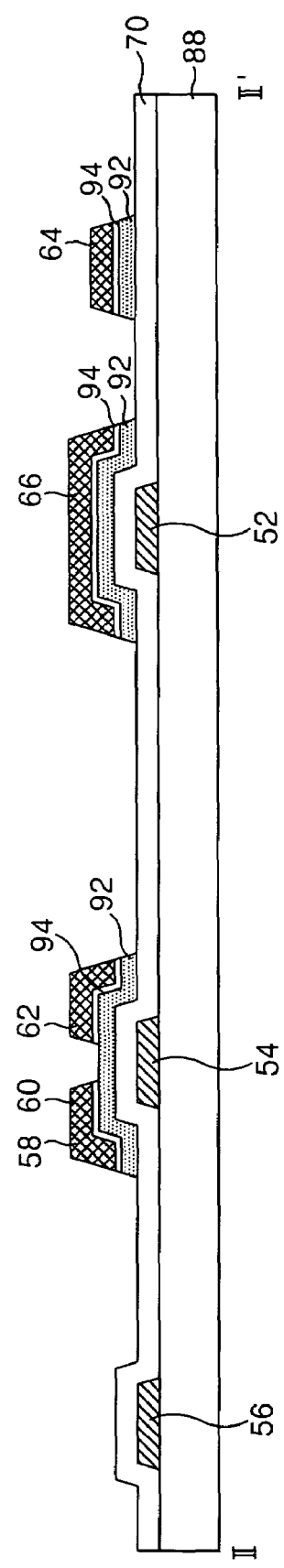

Next, as shown in FIG. 8C, the photo-resist pattern 71b having a relatively low height at the channel portion, may be removed by an ashing process. Thereafter, the source/drain pattern and the ohmic contact layer 94 of the channel portion may be etched by, for example, a dry etching process. Accordingly, the active layer 92 of the channel portion is preferably exposed to separate the source electrode 60 from the drain electrode 62, as shown in FIG. 8D.

Thereafter, a remainder of the photo-resist pattern left on the source/drain pattern part may be removed using a stripping process.

FIGS. 9A to 9E are plan views and sectional views of the substrate including the gate insulating layer 90, the passivation film layer 98 and the transparent electrode layer formed by the third mask process in the method of manufacturing the thin film transistor array substrate according to an exemplary process of the present invention.

A passivation film 98a, which may include an inorganic insulating material such as silicon oxide ($SiO_x$) and silicon nitride ($SiN_x$) or an organic insulating material having a small dielectric constant such as an acrylic organic compound, BCB (benzocyclobutene), PFCB (perfluorocyclobutane) or the like, may be entirely deposited by a deposition technique such as a sputtering on the gate insulating film 90a having the source/drain patterns thereon. And, a photo-resist may be entirely applied on the passivation film 98a. Subsequently, a photo-resist pattern 71c may be formed by a photolithography process using a third mask, as shown in FIG. 9B.

Subsequently, the passivation film 98a and the gate insulating film 90a may be patterned by a dry-etching using the photo-resist pattern 71c as a mask, thereby patterning the passivation layer pattern 98 and the gate insulating layer 90 at an area except for the area where a transparent electrode pattern will be formed.

The present invention employs an etching gas in which sulfur hexa fluoride $SF_6$ and oxygen $O_2$ are mixed with a ratio of about 3:1 to 10:1 by raising the ratio of sulfur hexa fluoride $SF_6$. Accordingly, a line width of the passivation film 98a beneath the photo-resist pattern 71c is narrowly over-etched relative to the width of the photo-resist pattern. The passivation film 98a is over-etched to assist in patterning the transparent electrode by substantially enabling the photo-resist layer 71c to be lifted off. In a preferred embodiment, an over-etched region d1 of the passivation film 98a has a width of less than about 2 μm.

More specifically, the sulfur hexa fluoride $SF_6$ reacts well with an inorganic insulating material such as $SiO_x$ or $SiN_x$, and the oxygen $O_2$ reacts well with a photo-resist pattern. Accordingly, when the passivation film 98a and the gate insulating film 90a are patterned by a dry-etching process using the photo-resist pattern 71c as a mask, if an etching gas in which the sulfur hexa fluoride $SF_6$ and the oxygen $O_2$ are mixed with the ratio of about 3:1 to about 10:1 is used, the sulfur hexa fluoride $SF_6$ may have an effect on an exposed lateral surface of the passivation film 98a. As a result, the exposed lateral surface of the passivation film 98a becomes over-etched.

Also, in the method of manufacturing the thin film transistor array substrate according to the present invention, another method for achieving the over-etching of the passivation film 98a is to pattern the passivation film 98a under a high pressure, for example, a pressure of about 300 mtorr to about 400 mtorr.

More specifically, if pressure is raised, a number of collisions over time between gas molecules increases and therefore, a mean free path becomes shorter. As a result, a straightness trajectory of the of the gas molecules is decreased and thus irregular movement, left and right, and upward and downward, of the gas molecules increases. Accordingly, the lateral surface of the passivation film 98a formed beneath the photo-resist pattern 71c undergoes much more influence by the increased number of gas molecules moving left and right, and upward and downward. Thus, the passivation film 98a formed beneath the photo-resist pattern 71c becomes over-etched.

In the method of manufacturing the thin film transistor array substrate according to the present invention, another exemplary method for achieving the over-etching of the passivation film 98a may be to perform an etching process that is divided into two exemplary steps upon patterning the passivation film 98a.

In a first step exemplary, the passivation film 98a may be patterned by only the sulfur hexa fluoride $SF_6$, as shown in FIG. 11A. As described above in the case that the passivation film 98a is patterned by using the photo-resist pattern as a mask, the lateral surface of the passivation film 98a undergoes much more influences by the sulfur hexa fluoride $SF_6$ relative to the oxygen. Accordingly the passivation film 98a formed beneath the photo-resist pattern 71c is over-etched.

Subsequently, in a second exemplary step, the gate insulating film 90a is patterned by the etching gas in which the oxygen $O_2$ is mixed with the sulfur hexa fluoride $SF_6$ whose proportion in the mixing ratio is thereby decreased. Herein, the mixing ratio of $SF_6:O_2$ is about 1:3. Decreasing the amount of the sulfur hexa fluoride $SF_6$ is generally for preventing an over-etching of the gate insulating film 90a. In other words, if the gate insulating film 90a is etched by only the sulfur hexa fluoride $SF_6$, the lateral surface of the gate insulating film 90a is also over-etched, which may cause a disconnection of the transparent electrode pattern to be formed on the gate insulating film 90a. Thus, it is possible to prevent the lateral surface of the gate insulating pattern 90 from being over-etched by patterning the gate insulating film 90a through the use of the etching gas in which the oxygen $O_2$ is mixed with the sulfur hexa fluoride $SF_6$ whose mixed ratio is decreased.

Figure 9A:
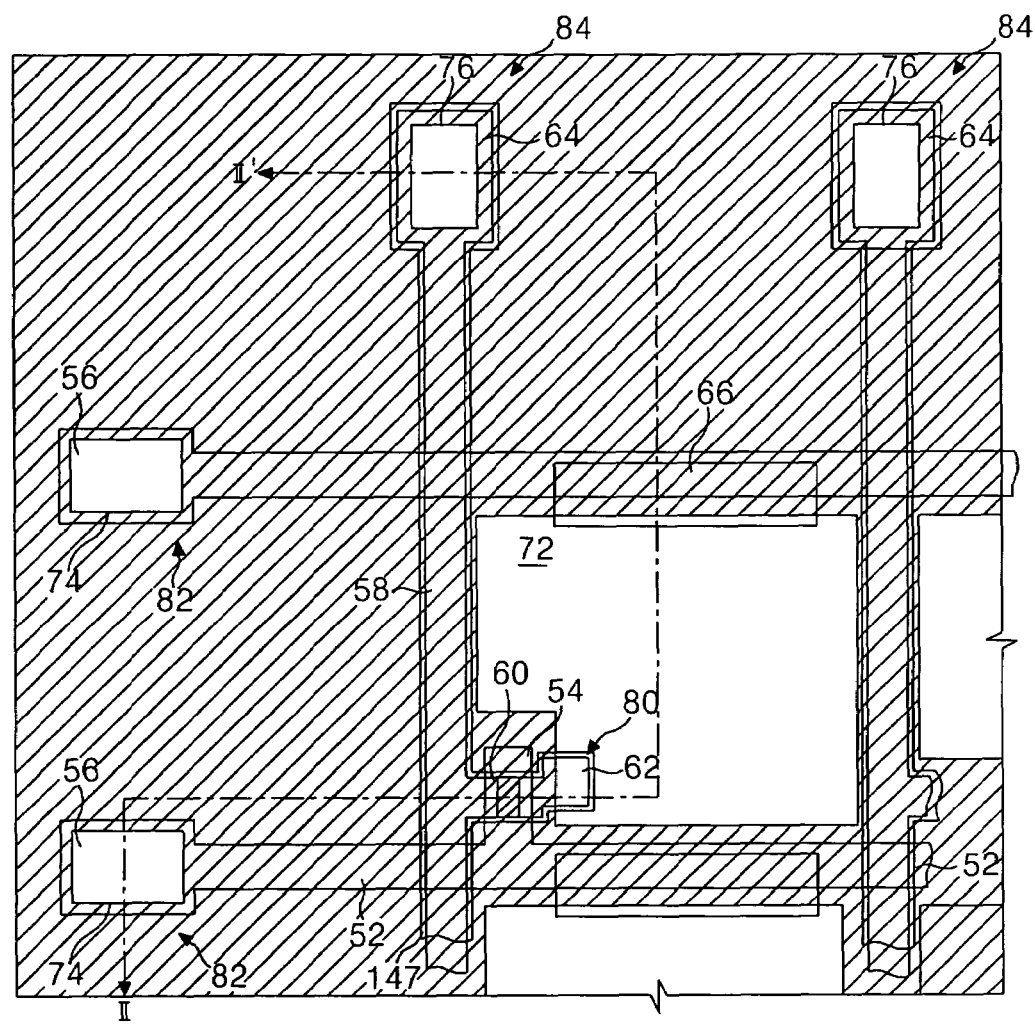
Figure 9C:
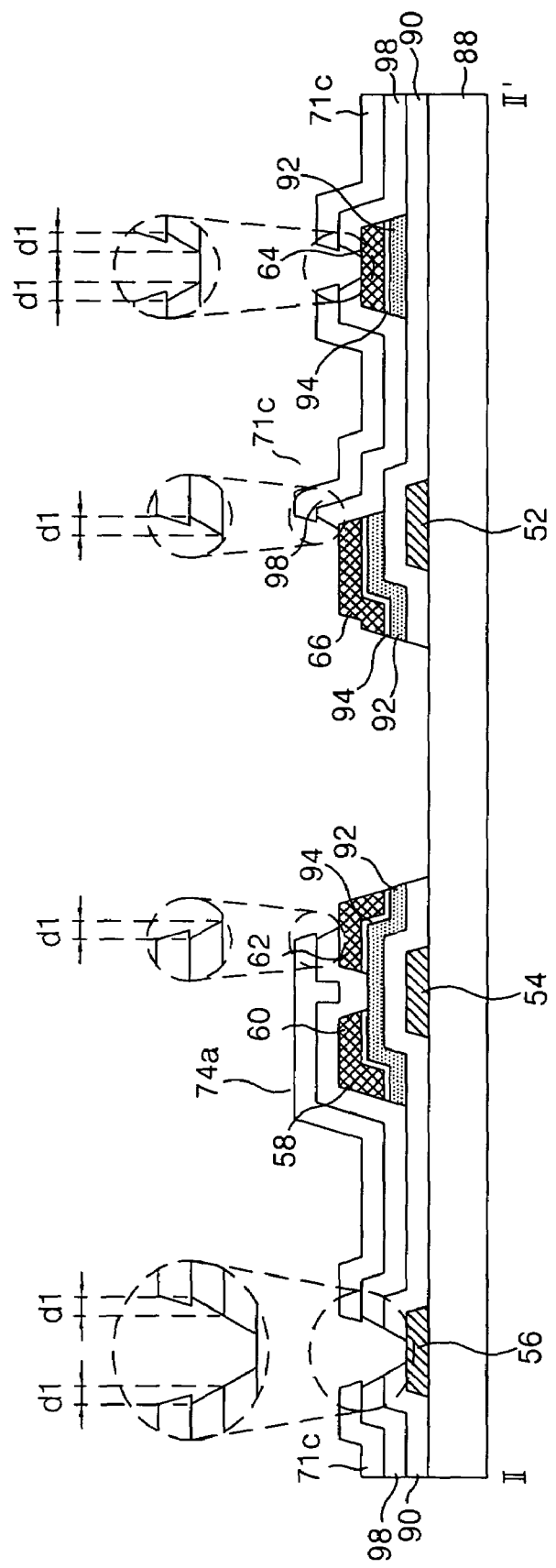
Figure 9D:
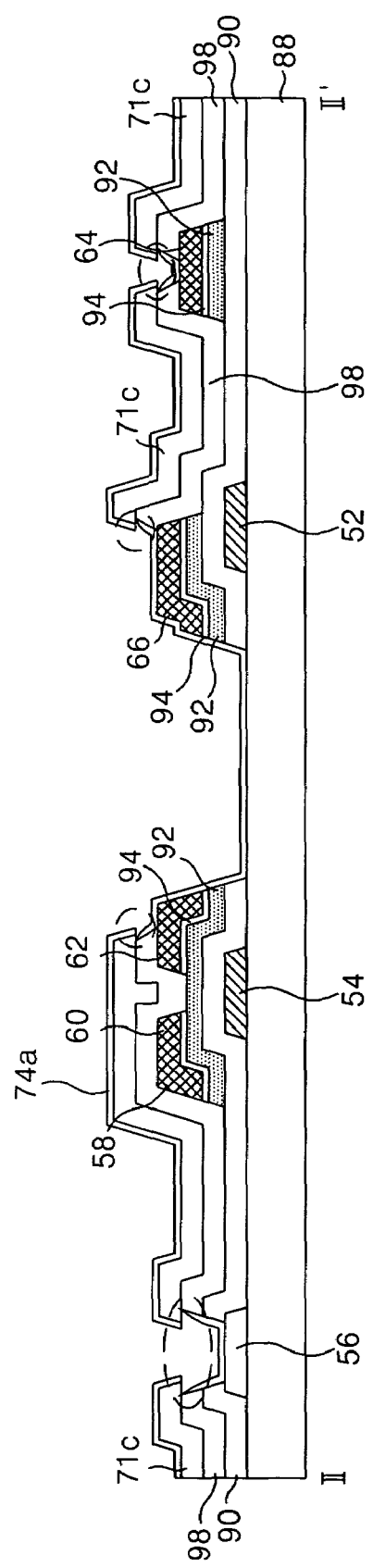

Subsequently, a transparent electrode material 74a may be deposited on the entire substrate by a deposition method such as a sputtering method on the substrate 88 having the remainder of the photo-resist pattern 71c. At this stage in the process, the transparent electrode material 74 is formed such that it can be separated between the passivation pattern 98 and the photo-resist pattern 71c by the over-etched passivation pattern more readily than on the photo-resist pattern, as shown in FIG. 9D. The transparent electrode material 74a may be made of an indium-tin-oxide (ITO), a tin-oxide (TO) or an indium-zinc-oxide (IZO).

Figure 9E:
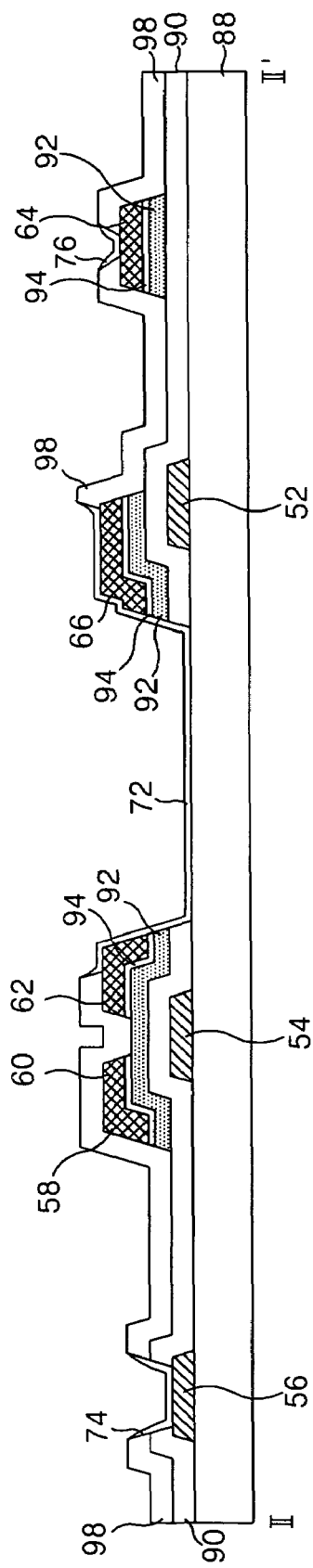
Figure 10B:
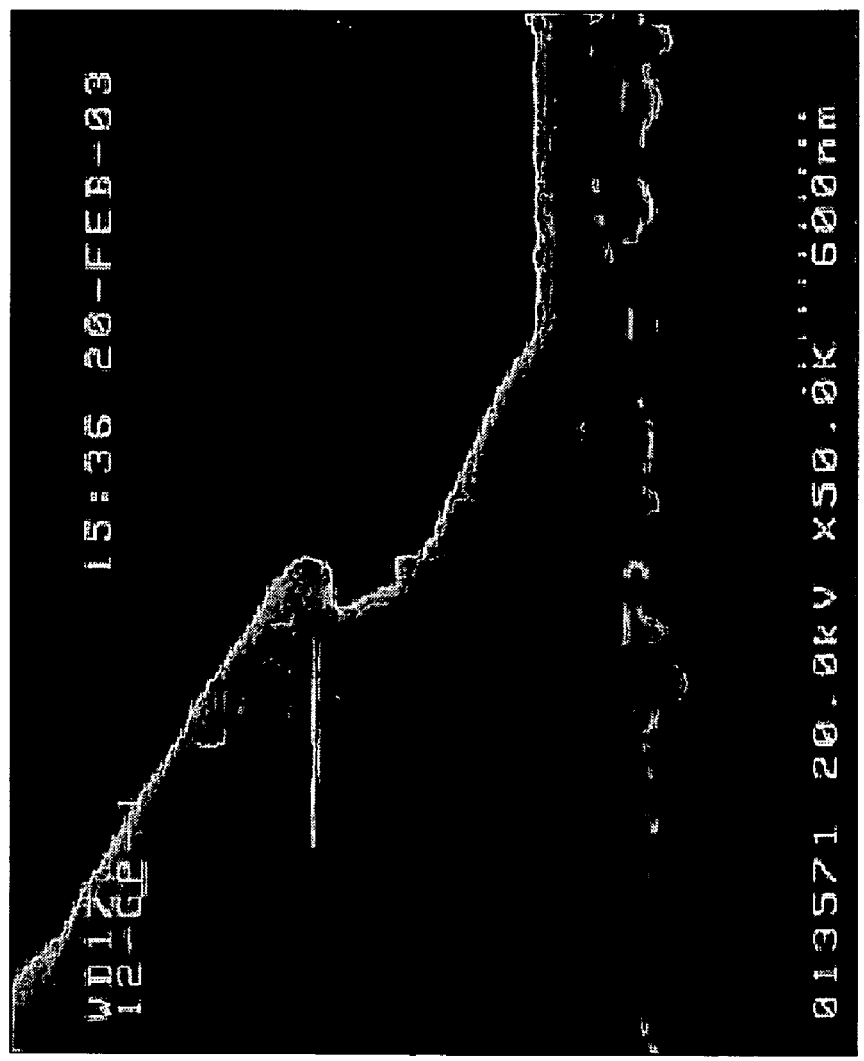
Figure 10C:
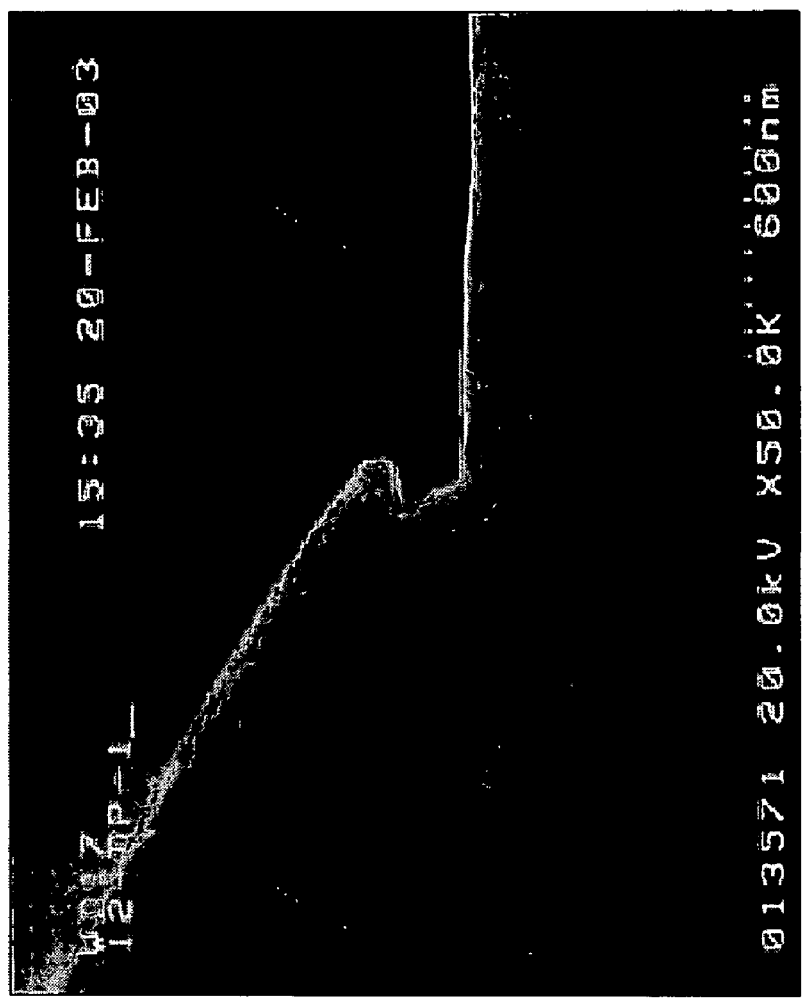

The photo-resist pattern 71c may then be removed by a stripping process using a lift-off method on the thin film transistor array substrate on which the transparent electrode material 74a is substantially entirely deposited. The transparent electrode material 74a deposited on the photo-resist pattern 71c may be removed together with the photo-resist pattern 71c, as shown in FIG. 9E, to form the transparent pattern including the upper gate pad electrode 74, the pixel electrode 72, and the upper data pad electrode 85. That is, because the transparent electrode material 74a is separated at the over-etched region, the transparent electrode material 74a deposited on the photo-resist pattern 71c may easily be removed along with the photo-resist pattern 71c as it is taken off.

In other words, a stripper solution easily permeates into a separated region of the transparent electrode material 74 formed substantially where the passivation layer 98 is over etched. During the stripping process, using the lift-off method, the transparent electrode material 74a formed on the photo-resist layer 71C may be easily removed.

Accordingly, subsequent to the removal of the photo resist, the upper gate pad electrode 74 may be connected to the lower gate pad electrode 56, the pixel electrode 72 may be electrically connected to the drain electrode of the thin film transistor and the storage electrode 66 of the storage capacitor 78, and the upper data pad electrode 85 may be electrically connected to the lower data pad electrode 64.

As described above, the method of manufacturing a thin film transistor array substrate according to the present invention involves over-etching the passivation film beneath the photo-resist pattern by further increasing a mixture ratio of $SF_6$, or a pressure upon, a patterned gate insulating film and passivation film, through the use of a combination of a lift-off method etching process using an etching gas. Alternatively, upon performing the dry etching of the passivation film and the gate insulating film, the passivation film and the gate insulating film may be patterned by differentiating the composition of each etching gas.

Accordingly, the transparent electrode pattern can be easily formed using a lift-off method according to the present invention.

As described above, the method of manufacturing the thin film transistor array substrate according to the present invention may be capable of simplifying the configuration of the substrate and the manufacturing process by adopting the three-round mask using the lift-off method. Accordingly, it may be possible to further decrease manufacturing costs and increase manufacturing yield.

Specifically, according to the method of manufacturing the thin film transistor array substrate according to the present invention, the lateral surface of the passivation film may be over-etched and the transparent electrode pattern made to be separated by the over-etching, thereby enabling the stripper solution to permeate the photo-resist at the separation during the stripping process. Accordingly, upon performing the stripping process of the photo-resist pattern by the lift-off method, the transparent electrode material deposited on the photo-resist pattern may may be easily patterned.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of manufacturing a thin film transistor array comprising:
    forming a gate pattern on a substrate;
    forming a gate insulating film on the substrate;
    forming a source/drain pattern and a semiconductor pattern on the substrate;

forming a passivation film on the substrate;
forming a photo-resist pattern on the passivation film;
patterning the passivation film using the photo-resist pattern to form a passivation film pattern, the patterning the passivation film including over-etching the passivation film;
forming a transparent electrode film on the substrate;
removing the photo-resist pattern and the transparent electrode film disposed on the photo-resist pattern; and
forming a transparent electrode pattern.

2. The method according to claim 1, wherein the forming the passivation film pattern includes forming the passivation film pattern having a line width narrower that that of the photo-resist pattern.

3. The method according to claim 1, wherein the forming the passivation film pattern includes patterning the passivation film using an etching gas in which a ratio of sulfur hexa fluoride $SF_6$ is higher than that of oxygen $O_2$.

4. The method according to claim 3, wherein the ratio of sulfur hexa fluoride $SF_6$ and oxygen $O_2$ is about 3:1 to about 10:1.

5. The method according to claim 1, wherein the forming the passivation film pattern includes etching the passivation film under a pressure of about 300 mtorr to 400 mtorr to form the passivation pattern.

6. The method according to claim 1, wherein the forming the passivation film pattern includes:
patterning the passivation film using sulfur hexa fluoride $SF_6$ using the photo-resist pattern as a mask; and
patterning the gate insulating film using a mixed gas including sulfur hexa fluoride $SF_6$ and oxygen $O_2$.

7. The method according to claim 6, wherein the mixed gas includes sulfur hexa fluoride $SF_6$ and the oxygen $O_2$ with a mixing ratio of about 1:3.

8. The method according to claim 1, wherein the forming the passivation film pattern includes patterning the passivation film and the gate insulating film using sulfur hexa fluoride $SF_6$ and using the photo-resist pattern as a mask.

9. The method according to claim 1, wherein the forming the gate pattern includes:
forming a gate electrode of a thin film transistor;
forming a gate line connected to the gate electrode; and
forming a lower gate pad electrode connected to the gate line, on the substrate.

10. The method according to claim 9, wherein the transparent electrode pattern includes a pixel electrode connected to the thin film transistor, an upper gate pad electrode connected to the lower gate pad electrode, and an upper data pad electrode electrically connected to data line of the source/drain pattern.

11. The method according to claim 9, further comprising:
forming an additional gate line; and
forming a storage electrode overlapping the another gate line, wherein a portion of the semiconductor pattern is disposed between the another gate line and the storage electrode, thereby substantially forming a storage capacitor.

12. The method according to claim 1, wherein the forming the source/drain pattern includes:
forming a source electrode of the thin film transistor;
forming a drain electrode of the thin film transistor; and
forming a data line connected to the source electrode.

13. The method according to claim 12, wherein the drain electrode and the storage electrode connect with a pixel electrode, and wherein the drain electrode and the storage electrode are partially exposed by the passivation film pattern.

14. The method according to claim 12, further comprising forming a lower data pad electrode and an upper data pad electrode, the lower data pad electrode formed with a material substantially similar to that of the data line along with the data line, and extended from the data line to connect to the upper data pad electrode.

15. The method according to claim 1, wherein the forming the semiconductor pattern includes forming the semiconductor pattern beneath the source/drain pattern along the source/drain pattern.

16. The method according to claim 1, wherein the removing the photo-resist pattern includes removing the photo-resist pattern and transparent electrode material on the photo-resist pattern using a stripping process to form the transparent electrode pattern.

17. The method according to claim 1, further comprising forming a lower data pad electrode and an upper data pad electrode, the lower data pad electrode connected to the data line via the upper data pad electrode, and formed with a material substantially similar to that of the gate pattern on a co-plane along with the gate pattern.

18. A method of manufacturing a thin film transistor array substrate comprising:
forming a thin film transistor on a substrate;
forming a passivation film on the substrate;
forming a photo-resist pattern on the passivation film;
patterning the passivation film by using the photo-resist pattern to form a passivation film pattern, the patterning including over-etching the passivation film; and
forming a pixel electrode being extended from a lateral surface of the passivation film pattern and formed on an area substantially exclusive of the passivation film pattern.

19. The method according to claim 18, wherein forming the passivation film pattern includes forming the passivation film pattern having a line width narrower than that of the photo-resist pattern.

20. The method according to claim 18, wherein the forming the pixel electrode includes:
forming a transparent electrode material on the substrate having a remainder of the passsivation film pattern and the photo-resist pattern left thereon; and
removing the photo-resist pattern and the transparent electrode material on the photo-resist pattern using a stripping process.

21. A method of manufacturing a thin film transistor array substrate comprising:
forming a gate pattern on a substrate;
forming a gate insulating film on the substrate;
forming a source/drain pattern and a semiconductor pattern on the substrate;
forming a passivation film on the substrate;
forming a photo-resist pattern on the passivation film;
patterning the passivation film using the photo-resist pattern to form a passivation film pattern, the passivation film pattern having a width narrower than a line width of the photo-resist pattern; and
forming a transparent electrode pattern on the substrate.

22. The method according to claim 21, wherein the forming the passivation film pattern includes patterning the passivation film using an etching gas in which a proportion of sulfur hexa fluoride $SF_6$ is higher than a proportion of oxygen $O_2$.

23. The method according to claim 22, wherein a ratio of sulfur hexa fluoride $SF_6$ and oxygen $O_2$ is approximately 3:1 to 10:1.

24. The method according to claim 21, wherein the forming the passivation film pattern includes etching the passivation film under a pressure of about 300 mtorr to 400 mtorr.

25. The method according to claim 21, wherein the forming the passivation film pattern includes:
    patterning the passivation film using sulfur hexa fluoride $SF_6$ and using the photo-resist pattern as a mask; and
    patterning the gate insulating film using a mixed gas comprising sulfur hexa fluoride $SF_6$ and oxygen $O_2$.

26. The method according to claim 25, wherein the mixed gas includes a mixing ratio of sulfur hexa fluoride $SF_6$ and oxygen $O_2$ of about 1:3.

27. The method according to claim 21, wherein the forming the passivation film pattern includes using sulfur hexa fluoride $SF_6$ and using the photo-resist pattern as a mask.

28. The method according to claim 21, wherein the forming a transparent electrode pattern includes:
    forming a transparent electrode material on the substrate having a remainder of the passsivation film pattern and the photo-resist pattern left thereon; and
    removing the photo-resist pattern and the transparent electrode material disposed on the photo-resist pattern using a stripping process.

* * * * *